(12) United States Patent
Campini et al.

(10) Patent No.: US 8,913,379 B2
(45) Date of Patent: Dec. 16, 2014

(54) TELECOMMUNICATIONS CHASSIS HAVING MEZZANINE CARD INTERFACES

(71) Applicants: Edoardo Campini, Mesa, AZ (US); Steven Denies, East Aurora, NY (US); Mark Summers, Phoenix, AZ (US); Lawson Guthrie, Portland, OR (US)

(72) Inventors: Edoardo Campini, Mesa, AZ (US); Steven Denies, East Aurora, NY (US); Mark Summers, Phoenix, AZ (US); Lawson Guthrie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/733,265

(22) Filed: Jan. 3, 2013

(65) Prior Publication Data
US 2013/0301208 A1 Nov. 14, 2013

Related U.S. Application Data

(63) Continuation of application No. 12/587,824, filed on Oct. 14, 2009, now Pat. No. 8,351,198, which is a continuation of application No. 11/027,142, filed on Dec. 29, 2004, now Pat. No. 7,751,333.

(51) Int. Cl.
*H05K 7/00* (2006.01)
*G06F 13/40* (2006.01)
*H05K 7/14* (2006.01)

(52) U.S. Cl.
CPC .......... *H05K 7/1487* (2013.01); *G06F 13/4081* (2013.01)
USPC ...... 361/679.37; 361/752; 361/760; 710/301; 710/311

(58) Field of Classification Search
USPC .............. 361/679.32–679.33, 679.37, 679.4, 361/715–720, 726, 736, 737, 748, 752, 753, 361/760, 788, 796
See application file for complete search history.

(56) References Cited

U.S. PATENT DOCUMENTS

| | | | |
|---|---|---|---|
| 4,935,845 A | 6/1990 | Schwehr et al. | |
| 5,761,033 A | 6/1998 | Wihelm | |
| 6,456,498 B1 | 9/2002 | Larson et al. | |
| 6,555,858 B1 | 4/2003 | Jones et al. | |
| 6,916,669 B2 | 7/2005 | Jones et al. | |
| 6,935,868 B1 * | 8/2005 | Campini et al. | 439/67 |
| 7,051,363 B2 | 5/2006 | Cheng et al. | |
| 7,131,849 B2 | 11/2006 | Nishimura et al. | |
| 7,259,325 B2 | 8/2007 | Pincu et al. | |
| 7,281,076 B2 | 10/2007 | Yates et al. | |
| 7,284,997 B2 | 10/2007 | Joist | |
| 7,415,551 B2 | 8/2008 | Pescatore | |

(Continued)

FOREIGN PATENT DOCUMENTS

| | | |
|---|---|---|
| CN | 1238492 A | 12/1999 |
| JP | 8-190395 A | 7/1996 |

(Continued)

OTHER PUBLICATIONS

Campini et al. "Method and Apparatus to Couple a Module to a Management Controller on an Interconnect", U.S. Appl. No. 12/587,824, filed Oct. 14, 2009, 32 pages.

(Continued)

*Primary Examiner* — Courtney Smith

(57) ABSTRACT

A telecommunications chassis includes an array of mezzanine card interfaces and a carrier module coupled to the mezzanine card interfaces to control and manage mezzanine cards connected to the mezzanine card interfaces.

7 Claims, 9 Drawing Sheets

(56) References Cited

U.S. PATENT DOCUMENTS

| | | | |
|---|---|---|---|
| 7,533,210 | B2 | 5/2009 | Chatterjee et al. |
| 2003/0055955 | A1 | 3/2003 | Cheng et al. |
| 2003/0084358 | A1 | 5/2003 | Bresniker et al. |
| 2004/0083356 | A1 | 4/2004 | Chatterjee et al. |
| 2004/0228063 | A1 | 11/2004 | Hawkins et al. |
| 2004/0249913 | A1 | 12/2004 | Kaufman, Jr. |
| 2005/0044284 | A1 | 2/2005 | Pescatore |
| 2005/0201073 | A1 | 9/2005 | Pincu et al. |
| 2005/0227505 | A1 | 10/2005 | Campini et al. |
| 2006/0126292 | A1 | 6/2006 | Pfahnl et al. |
| 2006/0140179 | A1 | 6/2006 | Campini et al. |
| 2006/0218329 | A1* | 9/2006 | DeNies et al. ............. 710/301 |
| 2007/0070566 | A1* | 3/2007 | Campini et al. ............. 361/90 |
| 2007/0121306 | A1 | 5/2007 | Moakes et al. |
| 2007/0238326 | A1* | 10/2007 | Fallah-Adl et al. ........... 439/67 |

FOREIGN PATENT DOCUMENTS

| | | | |
|---|---|---|---|
| JP | 2001-142811 | A | 5/2001 |
| JP | 2002-353664 | A | 12/2002 |
| JP | 2003-132038 | A | 5/2003 |
| JP | 2004-355351 | A | 12/2004 |
| JP | 2009-212600 | A | 9/2009 |
| TW | 519680 | A | 2/2003 |
| WO | 2006/071625 | A1 | 7/2006 |

OTHER PUBLICATIONS

Campini et al. "Method and Apparatus to Couple a Module to a Management Controller on an Interconnect", U.S. Appl. No. 11/027,142, filed Dec. 29, 2004, 32 pages.

International Search Report and Written Opinion received for PCT Patent Application No. PCT/US05/046078 mailed on Oct. 5, 2006, 11 pages.

"Advanced Mezzanine Card Short Form Specfication", PCI Industrial Computers Manufacturers Group, PICMG AMC.0, Jun. 15, 2004, pp. 1-57.

Advanced TCA, PICMG 3.0, Short Form Specifications, PCI Industrial Computers Manufacturers Group, Jan. 2003, pp. 1-33.

"Intelligent Platform Management Interface Specification Passage", IPMI, Intelligent Platform Management Interface Specification, Version 1.5, XP002346263, Feb. 20, 2002, pp. 9-10.

International Preliminary Report on Patentability and Written Opinion for Application No. PCT/US2005/046078 dated Jul. 12, 2007, 7 pages.

Office Action Received for Chinese Patent Application No. 200510119181.0, issued on Mar. 6, 2009, 10 Pages of Chinese Office Action, and 12 Pages of English Translation.

Office Action Received for Taiwanese Patent Application No. 94146176, issued on Jun. 22, 2009, 4 Pages of Taiwanese Office Action.

Office Action Received for Taiwanese Patent Application No. 94146176, mailed on Aug. 25, 2008, 3 Pages of Taiwanese Office Action, and 6 Pages of English Translation.

Office Action Received for Japanese Patent Application No. 2007-549465, mailed on Apr. 12, 2010, 2 Pages of Japanese Office Action, and 2 Pages of English Translation.

Office Action Received for Chinese Patent Application No. 200510119181.0, mailed on Sep. 14, 2007, 4 Pages of Chinese Office Action and 9 Pages of English Translation.

Office Action Received for Chinese Patent Application No. 200510119181.0, mailed on Aug. 20, 2010, 8 Pages of Chinese Office Action and 12 Pages of English Translation.

Office Action Received for Chinese Patent Application No. 200510119181.0, mailed on Feb. 16, 2011, 9 Pages of Chinese Office Action and 12 Pages of English Translation.

Office Action Received for Chinese Patent Application No. 201010621011.3, mailed on Jan. 4, 2012, 3 Pages of Chinese Office Action and 6 Pages of English Translation.

Office Action Received for European Patent Application No. 05854739.9, mailed on May 14, 2009, 3 pages.

Office Action Received for Korean Patent Application No. 10-2007-7014874, mailed on Sep. 25, 2008, 1 Page of English Translation only.

Office Action Received for U.S. Appl. No. 11/027,142, mailed on Oct. 22, 2007, 18 pages.

Office Action Received for U.S. Appl. No. 11/027,142, mailed on Oct. 27, 2008, 16 pages.

Office Action Received for U.S. Appl. No. 11/027,142, mailed on Apr. 14, 2008, 15 pages.

Notice of Allowance Received for U.S. Appl. No. 11/027,142, mailed on Feb. 22, 2010, 14 pages.

Office Action Received for U.S. Appl. No. 12/587,824, mailed on May 4, 2011, 9 pages.

Office Action Received for U.S. Appl. No. 12/587,824, mailed on Oct. 20, 2011, 7 pages.

Office Action Received for U.S. Appl. No. 12/587,824, mailed on Jan. 13, 2012, 9 pages.

Office Action Received for U.S. Appl. No. 12/587,824, mailed on Sep. 19, 2012, 8 pages.

Notice of Allowance Received for U.S. Appl. No. 12/587,824, mailed on Oct. 26, 2012, 7 pages.

Office Action Received for Chinese Patent Application No. 201010621011.3, mailed on Nov. 23, 2012, 5 Pages of Chinese Office Action and 8 Pages of English Translation.

Office Action Received for Chinese Patent Application No. 201010621011.3, mailed on May 29, 2013, 4 Pages of Chinese Office Action and 6 Pages of English Translation.

Office Action Received for Chinese Patent Application No. 201010621011.3, mailed on Oct. 22, 2013, 3 Pages of Chinese Office Action and 5 Pages of English Translation.

* cited by examiner

TELECOMMUNICATIONS CHASSIS HAVING MEZZANINE CARD INTERFACES

RELATED APPLICATION

This application is a Continuation of U.S. application Ser. No. 12/587,824, filed Oct. 14, 2009, now U.S. Pat. No. 8,351,198, which is a Continuation of U.S. application Ser. No. 11/027,142, filed Dec. 29, 2004, now U.S. Pat. No. 7,751,333. Both applications are herein incorporated by reference in their entirety.

TECHNICAL FIELD

Embodiments of the invention generally relate to the field of electronic systems, and more particularly, to a method and apparatus to couple a module to a management controller on an interconnect.

BACKGROUND

Modular systems are typically used in communication networks where reliability and cost effectiveness are important factors. Modular systems may include modular platforms. These modular platforms include backplanes that receive and couple blades, boards, or interconnects. Blades, boards, or interconnects may further include modules to provide additional functionality to the modular platform. Such additional functionality may include providing mass storage, graphics processors or I/O processors.

Typically, modules provide this additional functionality in a cost effective manner. Accordingly, the ability to add as many modules as possible to a given system and interconnect may be an objective when designing and operating a cost effective modular system. However, each blade, board, or interconnect typically contains a single management controller to support and/or control these modules. A single management controller may limit the number of modules that can be supported and/or controlled on a typical blade, board, or interconnect. This limit to the number of modules supported and/or controlled may be problematic in designing and operating a cost effective modular system.

BRIEF DESCRIPTION OF THE DRAWINGS

The invention is illustrated by way of example, and not by way of limitation, in the figures of the accompanying drawings in which like reference numerals refer to similar elements and in which.

DETAILED DESCRIPTION

Embodiments of the invention are generally directed to a method and apparatus to couple a module to a management controller on an interconnect. A module manager is introduced herein. The module manager is operable to logically couple a module to one of a plurality of management controllers responsive to an interconnect. The module may be received and coupled to an interface on an interconnect and the interconnect may be coupled to a modular platform backplane.

Figure 1:
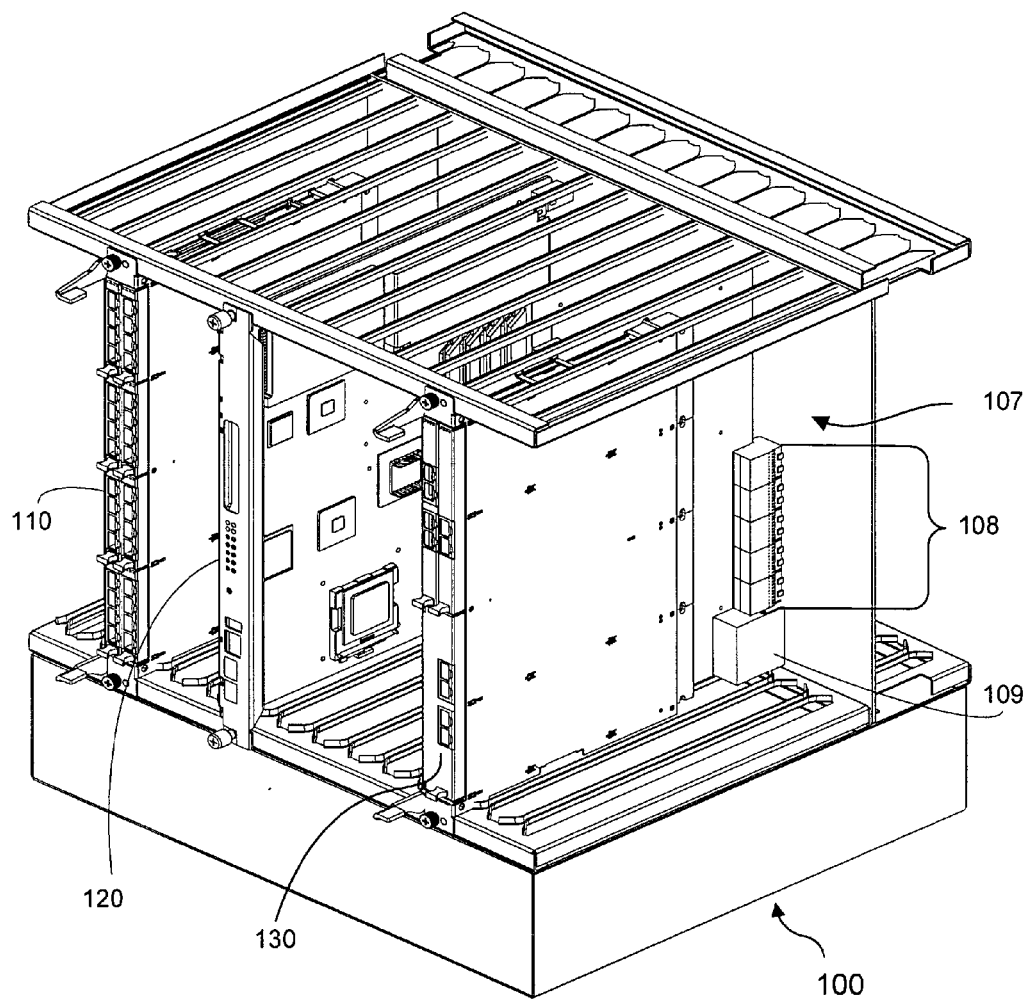
FIG. 1 provides a partial view of an example modular platform, according to one embodiment.

FIG. 1 provides a partial view of an example modular platform 100, according to one embodiment. Modular platform 100 may be a modular platform server designed to be compliant with the PCI Industrial Computer Manufacturers Group (PICMG), Advanced Telecommunications Computing Architecture (ATCA) Base Specification, PIGMG 3.0 Rev. 1.0, published Dec. 30, 2002 (hereinafter referred to as "the ATCA specification"). FIG. 1 shows a partial view of modular platform 100 having selected portions removed for clarity.

Modular platform 100 is depicted as including three interconnects 110, 120 and 130, although the invention is not limited in this regard. At least a subset of the interconnects in modular platform 100 may contain input/output (I/O) connectors 108 which couple to a backplane 107. I/O connectors 108 may enable devices resident on a given interconnect to communicate with one or more elements of modular platform 100 or through modular platform 100 to devices resident on other interconnects. At least a subset of the interconnects may also contain a power connector 109 to provide power to the interconnect from backplane 107.

In an example embodiment, interconnects 130 and 110 may be carrier cards designed to couple one or more modules to one or more module interfaces (e.g., slots or carrier bays) resident on a given interconnect. As described in more detail below, interconnects that include one or more modules may also include active circuitry to support and/or manage one or more aspects of one or more modules coupled to the interconnect.

Figure 2:
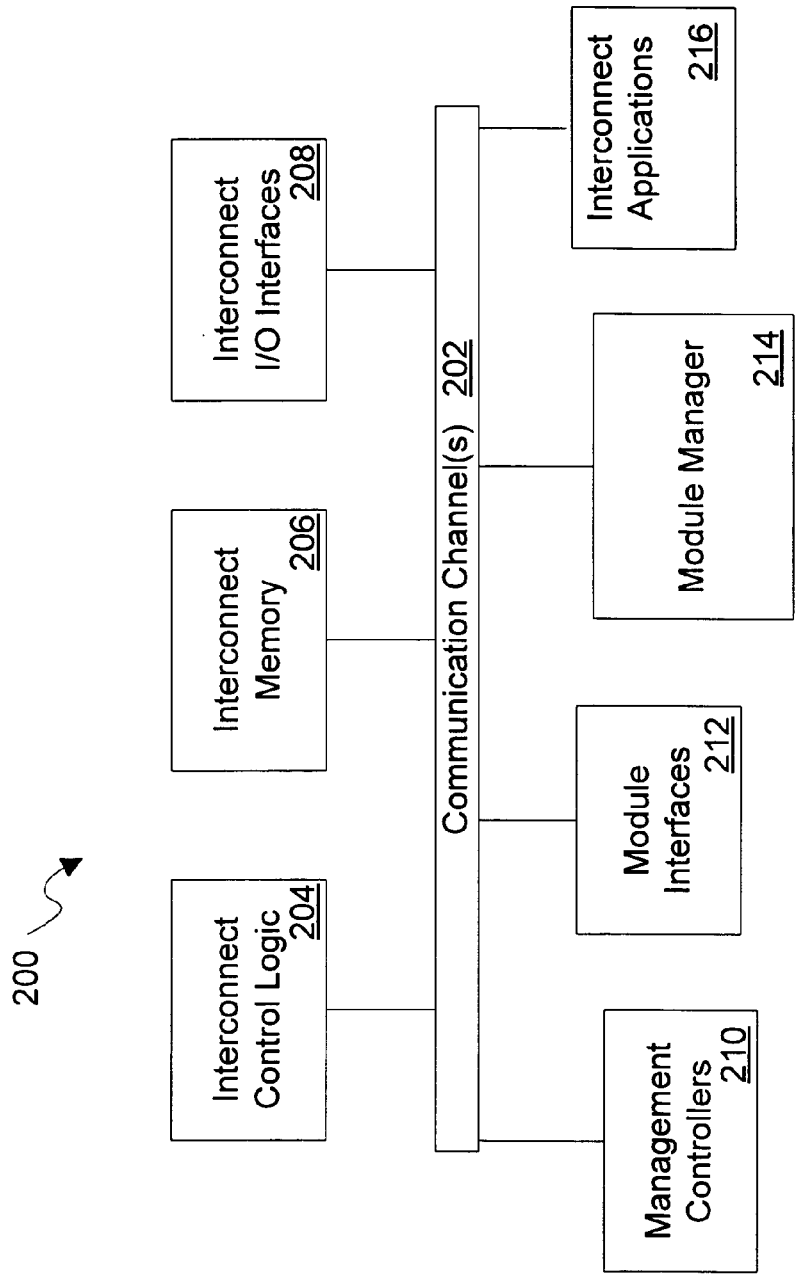
FIG. 2 illustrates an example electronic system, according to one embodiment.

FIG. 2 illustrates an example electronic system, according to one embodiment. The elements shown in electronic system 200 may represent a block diagram architecture of active circuitry resident on interconnect 110. This active circuitry may support and/or control one or more modules received and coupled to interconnect 110. As shown, electronic system 200 is depicted as including one or more communication channel (s) 202, interconnect control logic 204, interconnect memory 206, interconnect I/O interfaces 208, management controllers 210, module interfaces 212, module manager 214 and interconnect applications 216.

In an example embodiment, communication channel(s) 202 may include communication links routed between elements of electronic system 200 and may also include communication links routed through I/O connectors 108 to a modular platform backplane.

In an example embodiment, interconnect memory 206 may store information/features offered by electronic system 200. Interconnect memory 206 may also be used to store temporary variables or other intermediate information during execution of instructions by interconnect control logic 204. Interconnect memory 206 may well include a wide variety of memory media including but not limited to volatile memory, non-volatile memory, flash, programmable variables or states, random access memory (RAM), read-only memory (ROM), flash, or other static or dynamic storage media.

In an example embodiment, interconnect control logic 204 may invoke an instance of interconnect applications 216 and/or management controllers 210 to provide control and/or management for one or more modules that may be received and coupled to module interfaces 212. Control and/or management may be provided through communication channel(s) 202 or a combination of communication channel(s) 202 and interconnect I/O interfaces 208. For example, communication channel(s) 202 may include an interconnect management channel (e.g. a bus) to facilitate this control and/or management. Other elements of electronic system 200 may also communicate in the same manner, although the invention is not limited in this regard.

As described in more detail below, in an example embodiment, interconnect control logic 204 may invoke an instance of module manager 214 to logically couple a module to one of a plurality of management controllers 210.

Figure 3:
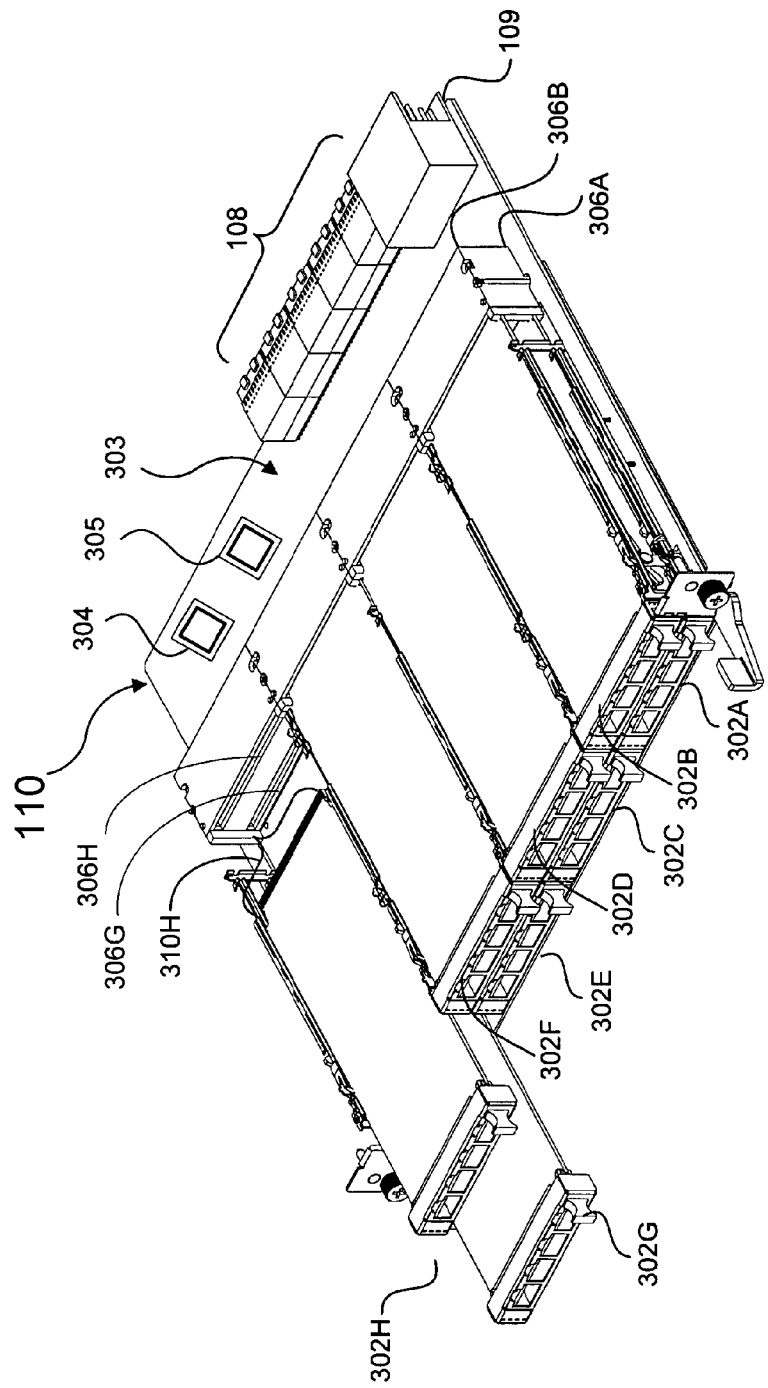
FIG. 3 is an isometric view of an example interconnect, according to one embodiment.

FIG. 3 is an isometric view of an example interconnect 110, according to one embodiment. Interconnect 110 includes module interfaces 306A-H, circuit board 303, management controllers 304 and 305, I/O connectors 108 and power connectors 109. In an example embodiment, interconnect 110 may be a carrier card designed to receive and couple one or more modules to one or more module interfaces resident on interconnect 110.

In the example embodiment shown in FIG. 3, modules 302A-G are depicted already received and coupled to module interfaces 306A-G, while module 302H is about to be coupled to module interface 306H. In an example embodiment, module 302H includes interface 310H. Interface 310H may couple module 302H to module interface 306H. Although not shown in FIG. 3, modules 302A-G also contain interfaces to couple each module to a respective module interface on interconnect 110.

In an example embodiment, module interfaces 212 of electronic system 200 may include module interfaces 306A-H. Accordingly, interconnect control logic 204 may invoke an instance of module manager 214 to logically couple a module received into any one of module interfaces 306A-H to management controllers 210. This logical coupling may include the control and/or management of the module once received and coupled to any one of module interfaces 306A-H.

In an example embodiment, management controllers 210 may include management controllers 304 and 305 shown in FIG. 3. Once module 302H is received and coupled to module interface 306H, module manager 214 may logically couple module 302H to management controller 304 and/or 305. After module 302H is logically coupled, management controller 304 and/or 305 may provide management and/or control functionality to module 302H. For example, module 302H may request to communicate with another module coupled to another interface resident on interconnect 110 (e.g., module 302G). The management controller logically coupled to module 302H may service the request and facilitate the communications between module 302H and the other module.

In an example embodiment, module interfaces 306A-H may also be referred to as "carrier bays" and modules 302A-H may also be referred to as "mezzanine cards." A mezzanine card may provide additional functionality to a carrier card when coupled to a carrier bay resident on the carrier card, although the invention is not limited in this regard. This additional functionality may include, but is not limited to, providing mass storage, graphics processing, or I/O processors.

In an example embodiment, Interconnect 110 may operate in compliance with both the ATCA specification and a proposed PIGMG specification. This proposed PIGMG specification provides guidelines for the design and operation of carrier cards and mezzanine cards. The proposed PICMG specification is known as the Advanced Mezzanine Card (AMC) Specification, PIGMG AMC.0 and is hereinafter referred to as "PICMG AMC.0."

In this example embodiment, modules 302A-H may also operate and/or be designed to operate in compliance with PICMG AMC.0. In this regard, a management controller (not shown) may be resident on each module 302A-H. In the proposed PICMG AMC.0 specification, the logical coupling of each module's management controller to a single management controller resident on an interconnect is described. In an example implementation, module manager 214 may logically couple a module's management controller to one of a plurality of management controllers resident on interconnect 110 (e.g. management controllers 304 and 305). Accordingly, this may enable the logical coupling of a PICMG AMC.0 compliant module to one of a plurality of management controllers resident on an interconnect. This logical coupling may occur, for example, when a module is received and coupled to a module interface resident on an interconnect, although the invention is not limited in this regard.

Figure 4:
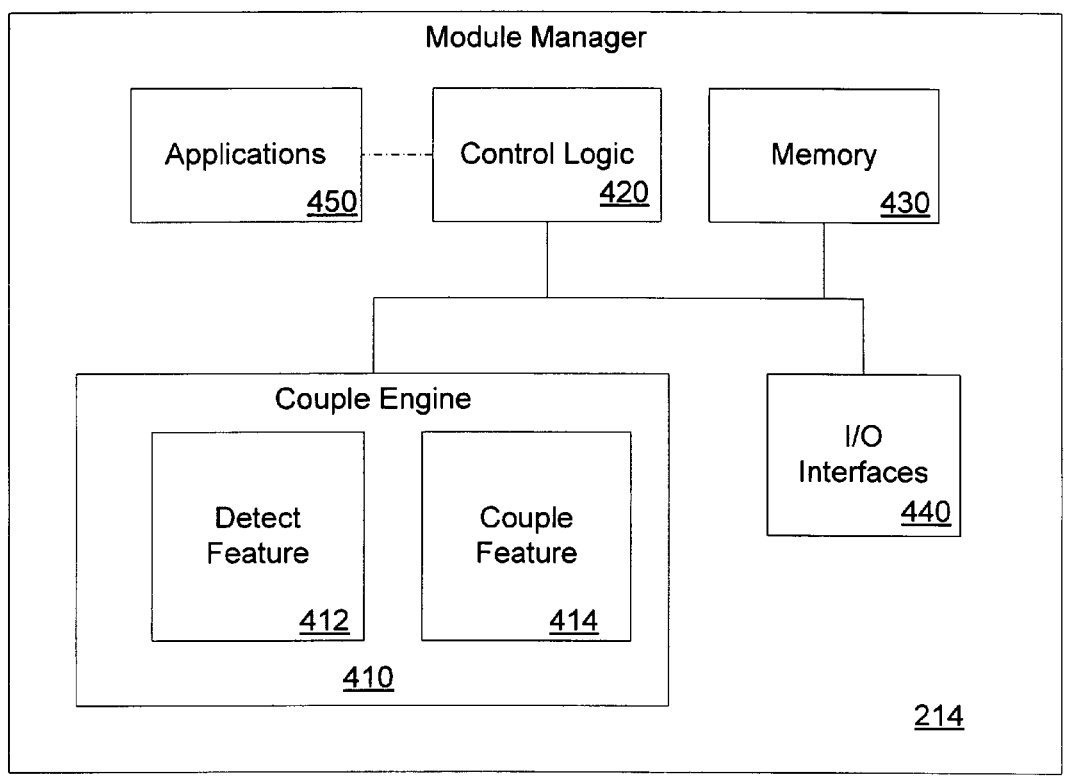
FIG. 4 is an architectural diagram of an example module manager, according to one embodiment.

FIG. 4 is an architectural diagram of an example module manager 214, according to one embodiment. Module manager 214 includes a couple engine 410, control logic 420, memory 430, I/O interface 440, and optionally one or more applications 450, each coupled as depicted.

In an example embodiment, couple engine 410 may include a detect feature 412, and couple feature 414. Detect feature 412 detects when a module is received in a module interface resident on an interconnect. Couple feature 414 then logically couples the received module to one of a plurality of management controllers responsive to and/or resident on the interconnect.

Control logic 420 controls the overall operation of module manager 214 and is intended to represent any of a wide variety of logic device(s) and/or executable content to implement the operation of module manager 214. Control logic 420 may well comprise a microprocessor, network processor, microcontroller, field programmable gate array (FPGA), application specific integrated circuit (ASIC), or executable content to implement such control features, and/or any combination thereof. In alternate embodiments, the features and functionality of control logic 420 may well be implemented within couple engine 410.

In an example embodiment, control logic 420 invokes an instance of couple engine 410 to logically couple a module received in a module interface resident on an interconnect to one of a plurality of management controllers responsive to the interconnect. As used herein, memory 430 is intended to represent a wide variety of memory media including, but not limited to volatile memory, non-volatile memory, flash and programmatic variables or states.

According to an example embodiment, memory 430 is used to temporarily store a mapping table. This mapping table may be used to facilitate the logical coupling of a module to a management controller responsive to an interconnect.

I/O interfaces 440 provide a communication interface between module manager 214 and an electronic system. For example, module manager 214 may be implemented as an element of a electronic system (e.g., electronic system 200), wherein I/O interfaces 440 provide a communication interface between module manager 214 and the electronic system via a communication channel (e.g., communication channel(s) 202). Control logic 420 can receive a series of instructions from application software external to module manager 214 via I/O interfaces 440. The series of instructions may invoke control logic 420 to implement one or more features of couple engine 410.

In an example embodiment, module manager 214 may include one or more applications 450 to provide instructions to control logic 420. Such applications 450 may well be invoked to generate a user interface, e.g., a graphical user interface (GUI), to enable administration features, and the like. In alternate embodiments, one or more features of couple engine 410 may well be implemented as applications 450, invoked by control logic 420 to invoke such features.

Figure 5:
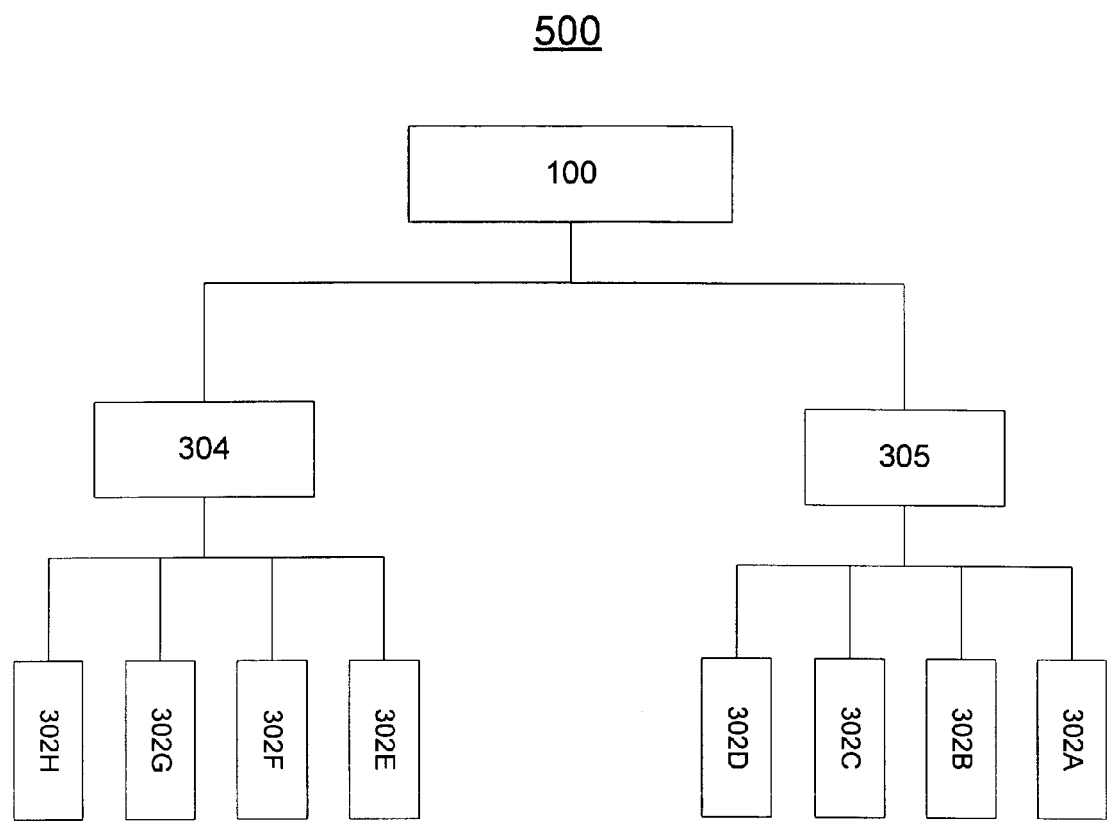
FIG. 5 illustrates an example block diagram architecture for the logical coupling of modules to management controllers on an interconnect, according to one embodiment.

FIG. 5 illustrates an example block diagram architecture 500 for the logical coupling of modules 302A-H to management controllers 304 and 305 resident on interconnect 110, according to one embodiment. According to this example embodiment, interconnect 110 is to be received and coupled to backplane 107 on modular platform 100. Interconnect 110 and modular platform 100 may be compliant with the ATCA specification. Accordingly, modular platform 100 may manage/control boards or interconnects over a system management bus known as the Intelligent Platform Management Bus or "IPMB-0" (not shown). When interconnect 110 is received and coupled to backplane 107, a modular platform 100 system management function known as a "shelf manager" may detect this coupling and may enable power and/or communication links to interconnect 110. Once coupled, shelf managers may continue to monitor and control interconnect 110 as well as other interconnects coupled to the backplane and responsive to the IPMB-0.

In an example embodiment, an ATCA compliant interconnect may also contain a management controller known as Intelligent Platform Management Controller or "IPMC." An IPMC may manage the communications between the interconnect and the shelf manager and then may relay any instructions and/or information from the shelf manager (e.g., over an interconnect management channel) to components (e.g., modules) coupled to the interconnect.

In an example embodiment, interconnect 110 may operate in compliance with the ATCA Specification as well as PICMG AMC.0. Additionally, interconnect 110 may include a plurality of management controllers. In this example embodiment, the plurality of management controllers may include management controllers 304 and 305. Management controllers 304 and 305 may each perform the functionality of an ATCA compliant interconnect IPMC and also may be logically coupled to one or more modules 302A-H. Thus, the shelf manager may communicate to the plurality of management controllers on interconnect 110 over the IPMB-0 as if each management controller were representing a single ATCA compliant interconnect. For example, when interconnect 110 couples to backplane 107, management controllers 304 and 305 may each logically appear as a management controller for an ATCA compliant interconnect. Accordingly, interconnect 110 may logically appear to occupy the resources of two interconnects while physically coupling to backplane 107 as one interconnect, although the invention is not limited in this regard.

In an example embodiment, interconnect 110 is received and coupled to backplane 107 on modular platform 100. Once coupled to backplane 107, interconnect control logic 204 invokes an instance of module manager 214 to logically couple management controllers 304 or 305 to modules already received and coupled to module interfaces resident on interconnect 110. For example, couple engine 410 invokes an instance of detect feature 412 to survey what modules are received and coupled to module interfaces 306A-H. Detect feature 412 may then place the results of the survey into a table temporarily stored in a memory (e.g., memory 430). After the survey is complete, couple engine 410 invokes an instance of couple feature 414 to access the table stored by detect feature 412 and then logically couple each module to either management controller 304 or 305, although the invention is not limited in this regard.

In an example implementation, couple feature 414 may create a mapping table to indicate what modules are logically coupled to what management controllers. This mapping table may be temporally stored in a memory (e.g. memory 430). The mapping table, for example, may result in the logical coupling depicted in block diagram architecture 500.

Once the mapping table is temporarily stored in a memory, detect feature 412 may monitor module interfaces 306A-H to detect whether a module is either uncoupled or a new module is received and coupled. If a module is removed and/or another module is added, couple feature 412 may then update the mapping table to reflect any possible changes to logical couplings to management controllers 304 or 305.

In an example embodiment, couple feature 414's determination of what module to map to a specific management controller may be based on fixed or dynamic criteria. Fixed criteria, for example, may be based on assigning a given module interface to a given management controller. Thus, when detect feature 412 detects the receipt and coupling of a module to that given module interface, the module is logically coupled to that management controller by couple feature 414. Dynamic criteria, for example, may be based on factors that may allow modules to be logically coupled to management controllers regardless of what given module interface the module is received and coupled to. For example, modules may be logically coupled to balance the load between management controllers. Thus, as modules are added or removed from an interface resident on an interconnect, couple feature 414 may dynamically adjust the logical couplings to rebalance the load between the management controllers.

In an example embodiment, the shelf manager on modular platform 100 may want to power down at least a portion of the modules logically coupled to management controllers 304 and 305. Thus, the shelf manager sends a power down request over the IPMB-0 to the management controllers. Management controllers 304 and 305 may receive the command through interconnect I/O interfaces 208 and then power down modules logically coupled to each management controller to meet the shelf manager's request, although the invention is not limited in this regard.

Figure 6:
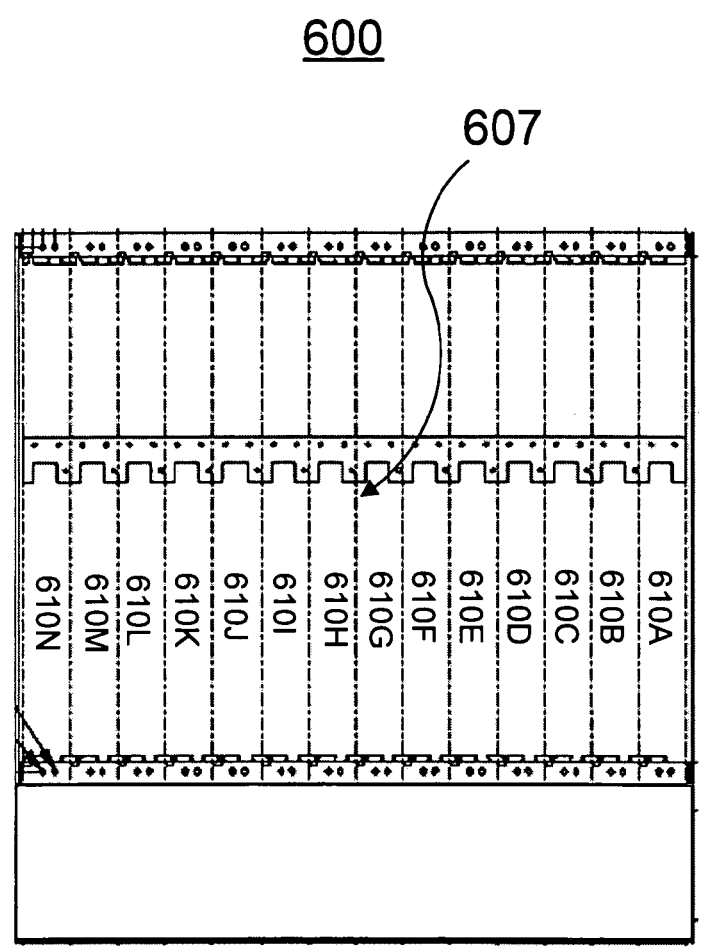
FIG. 6 provides a view of an example modular platform with slots to receive and couple interconnects to a backplane, according to one embodiment.

FIG. 6 provides a view of an example modular platform 600 with 14 slots to receive and couple interconnects to a backplane 607, according to one embodiment. In an example embodiment, modular platform 600 is compliant with the ATCA specification and includes slots 610A-N to receive and couple interconnects to a backplane 607. Accordingly, slots 610A-N may each contain interfaces to receive I/O and power connectors located on each interconnect to be coupled to modular platform 600.

In an example embodiment, FIG. 6 illustrates how an interconnect may be received and coupled to backplane 607 in a vertical manner. For example, interconnect 110 may be received and coupled into slot 610A in a vertical manner.

Thus, all the modules coupled to interconnect 110 may be inserted into module interfaces 306A-H in a vertical manner as well.

Figure 7:
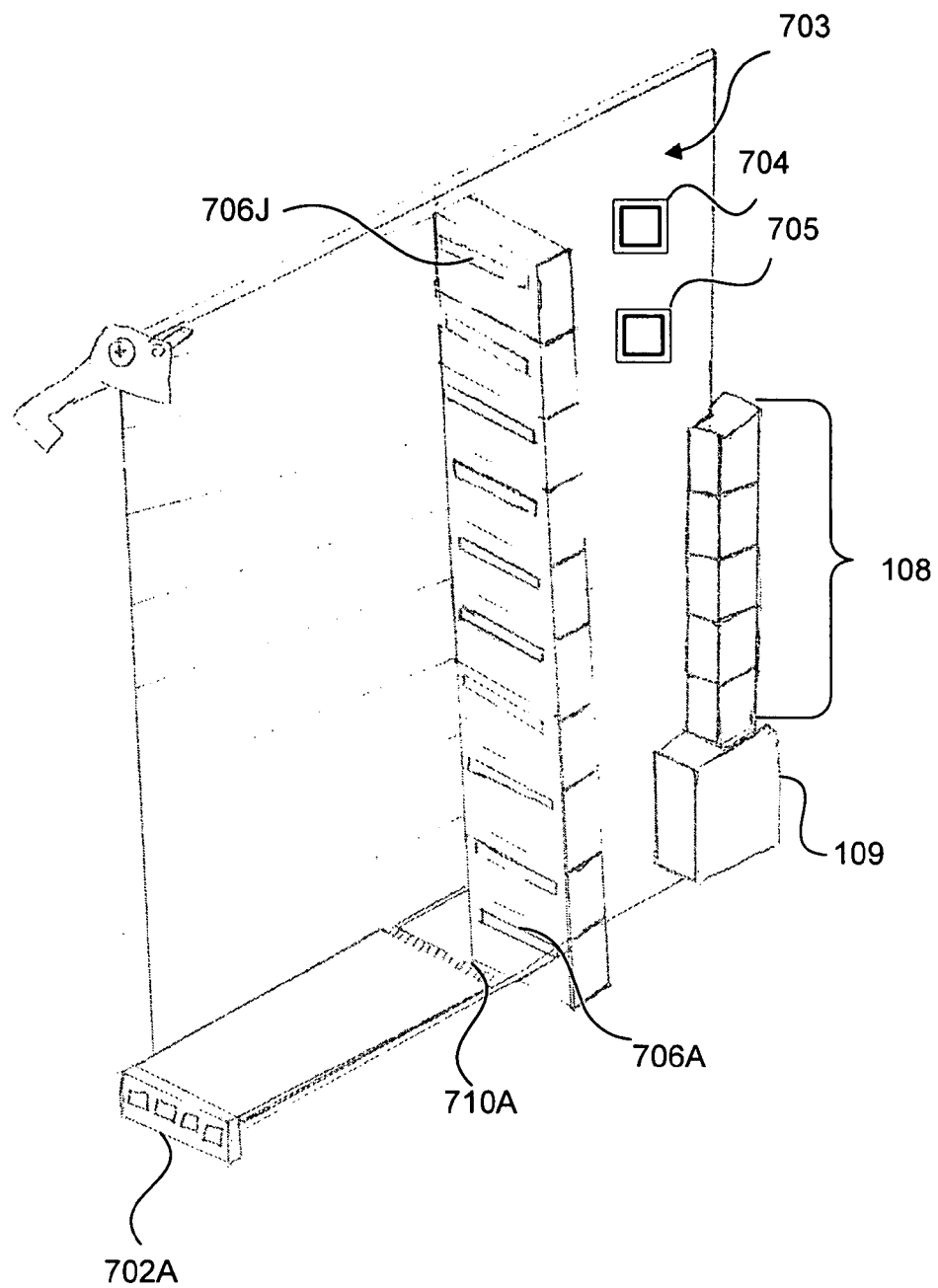
FIG. 7 is an isometric view of an example interconnect with interfaces to receive and couple modules in a horizontal manner, according to one embodiment.

FIG. 7 is an isometric view of an example interconnect 700 with interfaces to receive and couple modules in a horizontal manner, according to one embodiment. In an example embodiment, interconnect 700 includes similar elements to that of interconnect 110. However, interconnect 700 may include a number (e.g., ten (10)) of module interfaces 706A-J that may receive and couple modules to interconnect 700 in a horizontal manner.

In an example embodiment, to receive and couple in a horizontal manner, module interface 706A may receive and couple to module 702A so that module 702A is perpendicular to circuit board 703. Accordingly, module 702A is received and coupled in a horizontal manner, although the invention is not limited in this regard.

Figure 8:
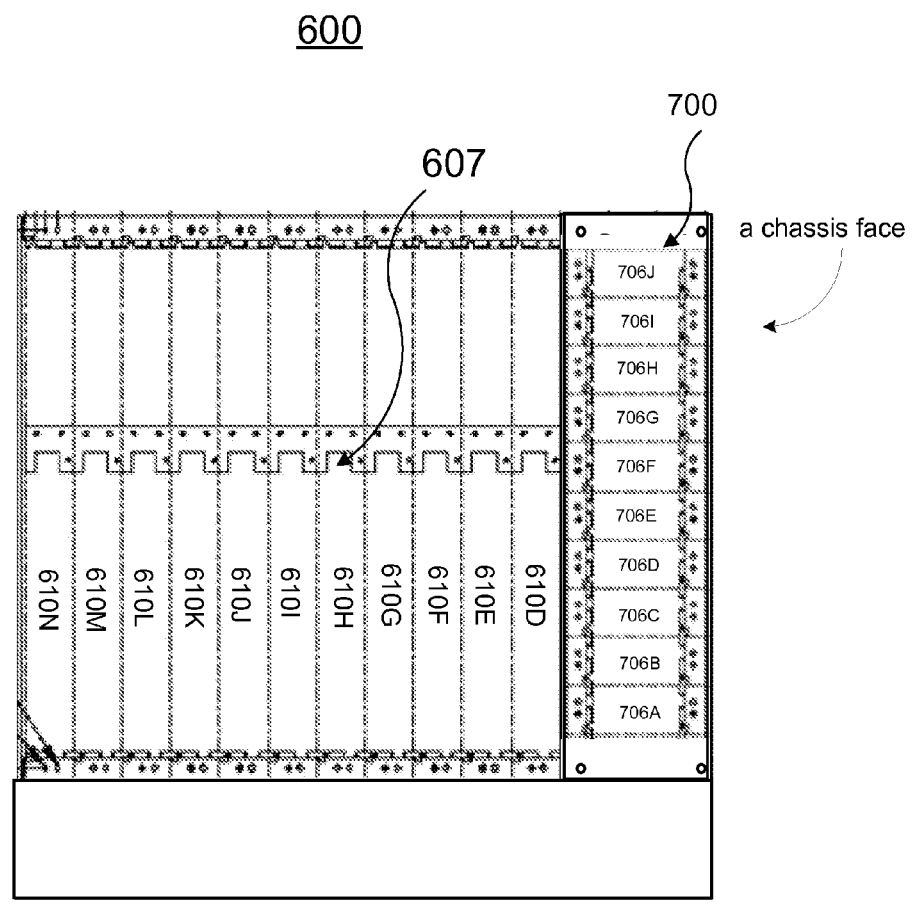
FIG. 8 provides a view of an example modular platform with an interconnect received and coupled into three slots, according to one embodiment.

FIG. 8 provides a view of an example modular platform 600 with interconnect 700 received and coupled into slots 610L-N, according to one embodiment. In an example implementation, when interconnect 700 is received and coupled to slots 610L-N, module interfaces 706 L-N may physically appear to receive and couple a module to a backplane for a modular platform. For example, when module 702A is coupled to module interface 706A, module 702A may physically appear to connect to an interface resident on backplane 607 rather than to an interface resident on interconnect 700, although the invention is not limited in this regard.

As shown in FIG. 8, boards or interconnects to be received and coupled to slots 610A-K are received in a vertical manner. In slots 610A-C interconnect 700 may also be inserted in a vertical manner. However, module interfaces 706A-J may appear to receive and couple modules to an interface resident on backplane 607 in a horizontal manner, although the invention is not limited in this regard.

Figure 9:
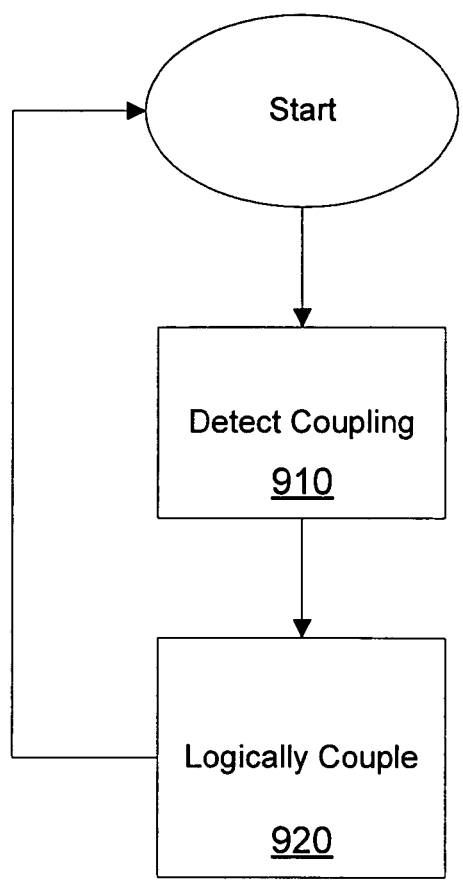
FIG. 9 is a flow chart of an example method to couple a module to a management controller on an interconnect, according to one embodiment.

FIG. 9 is a flow chart of an example method to couple a module to a management controller on an interconnect, according to one embodiment. In this example embodiment, interconnect 700 is received and coupled to backplane 607 of modular platform 600 as depicted in FIG. 8. Accordingly, interconnect logic 204 may already have invoked an instance of module manager 214 to monitor module interfaces 706A-J for indications of modules received or removed from these module interfaces resident on interconnect 700.

The process begins in block 910, where according to an example embodiment, module 702A is to be received and coupled to module interface 706A of interconnect 700. In an example implementation, to detect when a module is received and coupled to a module interface, detect feature 412 may monitor module interfaces 706A-J. For example, detect feature 412 may monitor impedance on a pin, connector, or wire within or responsive to a module interface. Accordingly, when module 702A is received and coupled to module interface 706A, detect feature 412 may detect this receipt and coupling by changes in the impedance on a pin, connector or wire in module interface 706A, although the invention is not limited in this regard.

In block 920, upon detect feature 412's detection of the receiving and coupling of module 702A, couple engine 410 invokes an instance of couple feature 414. Couple feature 414 may logically couple module 702A to one of the management controllers resident on and/or responsive to interconnect 700. For example, couple feature may logically couple module 702A to management controller 705 by populating one or more entries in a mapping table. The mapping table is then temporary stored in a memory (e.g., memory 430). In an example implementation, once the mapping table is populated it may then be used by either management controller 704 or 705 to determine which module to manage and/or control on interconnect 700.

Once module 702A's is logically coupled, the process may start over if another module is received and coupled in another module interface resident interconnect 700.

Reference is made again to the illustration of electronic system 200 in FIG. 2 where electronic system 200 represents the active circuitry on an interconnect. In accordance with one embodiment, interconnect control logic 204 controls the overall operation of electronic system 200 and is intended to represent any of a wide variety of logic device(s) and/or executable content to implement the operation of electronic system 200, described herein. In this regard, interconnect control logic 204 may well comprise a microprocessor, network processor, microcontroller, FPGA, ASIC, executable content to implement such control features and/or any combination thereof.

In accordance with one example embodiment, machine-readable instructions can be provided to interconnect memory 206 from a form of machine-accessible medium. As used herein, a machine-accessible medium is intended to represent any mechanism that provides (i.e., stores and/or transmits) information in a form readable by a machine (e.g., electronic system 200). For example, a machine-accessible medium may well include: ROM; RAM; magnetic disk storage media; optical storage media; flash memory devices; electrical, optical, acoustical or other form of propagated signals (e.g., carrier waves, infrared signals, digital signals); and the like. Instructions may also be provided to interconnect memory 206 via a remote connection through interconnect I/O interfaces 208 (e.g., over a communication network).

Interconnect I/O interfaces 208 may enable one or more element(s), e.g., interconnect control logic 204, to interact with input and/or output devices, for example, a mouse, keyboard, touchpad, cathode ray tube monitor, liquid crystal display, etc.

Management controllers 210 may well comprise a microprocessor, network processor, microcontroller, FPGA, ASIC, or executable content to implement such control features, and/or any combination thereof. In alternate embodiments, the features and functionality of management controllers 210 may well be implemented within interconnect control logic 204.

According to one example embodiment, module manager 214's logical coupling of a module to one of a plurality of management controllers may well be implemented in hardware, software, firmware, or any combination thereof. For example, module manager 214 may well be implemented as one or more of an ASIC, special function controller or processor, FPGA, other hardware device, and firmware or software to perform at least the functions described herein.

In the previous descriptions, for the purpose of explanation, numerous specific details were set forth in order to provide a thorough understanding of the invention. It will be apparent, however, to one skilled in the art, that the invention can be practiced without these specific details. In other instances, structures and devices were shown in block diagram form in order to avoid obscuring the invention.

References made in the specification to the term "responsive to" are not limited to responsiveness to only a particular feature and/or structure. A feature may also be "responsive to" another feature and/or structure and also be located within or resident on that feature and/or structure. Additionally, the term "responsive to" may also be synonymous with other terms such as "communicatively coupled to" or "operatively coupled to", although the term is not limited in this regard.

References made in the specification to "one embodiment" or "an embodiment" means that a particular feature, structure or characteristic described in connection with that embodiment is included in at least one embodiment of the invention. Thus, the appearances of the phrase "in one embodiment" appearing in various places throughout the specification are not necessarily all referring to the same embodiment. Likewise, the appearances of the phrase "in another embodiment," or "in an alternate embodiment" appearing in various places throughout the specification are not all necessarily referring to the same embodiment.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative of, rather than limiting the scope and coverage of the claims appended hereto.

What is claimed is:

1. A system, comprising:
    a telecommunications chassis, the telecommunications chassis comprising:
        an array of multiple mezzanine card interfaces to couple to carrier card interfaces of mezzanine cards, the mezzanine card interfaces accessible from a face of the chassis, the mezzanine card interfaces to provide defined carrier card signals to the mezzanine cards when coupled, the mezzanine card interfaces arranged in parallel along a first axis along the face of the chassis, wherein each of the mezzanine card interfaces is coextensive along a second axis along the face of the chassis perpendicular to the first axis, wherein each of the multiple mezzanine card interfaces is controlled and managed by a same carrier module; and
        the carrier module coupled to the array of multiple mezzanine card interfaces, the carrier module to control provision of power to the mezzanine card interfaces, provide an Intelligent Platform Management Bus IPMB-0, and control detection of coupling for each of the multiple mezzanine card interfaces;
    wherein the mezzanine card interfaces are physically presented as chassis backplane interfaces, not mezzanine card interfaces of a removable carrier card.

2. The system of claim 1,
    further comprising at least one Intelligent Platform Management Controller (IPMC) management controller to couple to inserted mezzanine cards.

3. The system of claim 2,
    wherein the at least one IPMC comprises multiple IPMCs; and
    further comprising logic to couple an inserted mezzanine card to a one of the multiple IPMC controllers.

4. The system of claim 1,
    further comprising respective mezzanine cards inserted into the respective mezzanine card interfaces, at least one of the inserted mezzanine cards comprising a mass storage mezzanine card.

5. The system of claim 1, wherein the mezzanine card interfaces comprise Advanced Mezzanine Card (AMC) type interfaces.

6. The system of claim 1,
    further comprising respective mezzanine cards inserted into the respective mezzanine card interfaces, at least one of the inserted mezzanine cards comprising a mezzanine card to provide graphics processing functionality.

7. The system of claim 1, wherein the multiple mezzanine card interfaces comprise ten mezzanine card interfaces.

* * * * *